(12) United States Patent
Nakamura et al.

(10) Patent No.: US 10,847,434 B2
(45) Date of Patent: *Nov. 24, 2020

(54) METHOD OF MANUFACTURING SEMICONDUCTOR DEVICE, AND MOUNTING APPARATUS

(71) Applicant: SHINKAWA LTD., Tokyo (JP)

(72) Inventors: Tomonori Nakamura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 53 days.

This patent is subject to a terminal disclaimer.

(21) Appl. No.: 16/337,925

(22) PCT Filed: Sep. 29, 2017

(86) PCT No.: PCT/JP2017/035469
§ 371 (c)(1),
(2) Date: Jun. 17, 2019

(87) PCT Pub. No.: WO2018/062482
PCT Pub. Date: Apr. 5, 2018

(65) Prior Publication Data
US 2019/0311964 A1 Oct. 10, 2019

(30) Foreign Application Priority Data

Sep. 30, 2016 (JP) .................................. 2016-194946

(51) Int. Cl.
*H01L 23/31* (2006.01)
*H01L 25/00* (2006.01)
(Continued)

(52) U.S. Cl.
CPC .......... *H01L 23/3114* (2013.01); *H01L 24/81* (2013.01); *H01L 24/96* (2013.01);
(Continued)

(58) Field of Classification Search
CPC ....... H01L 24/92; H01L 24/83; H01L 25/065; H01L 25/07; H01L 24/96; H01L 25/0657;
(Continued)

(56) References Cited

U.S. PATENT DOCUMENTS

2016/0141273 A1* 5/2016 Tsuji .................. H01L 25/0657
257/737
2019/0312020 A1* 10/2019 Nakamura ............ H01L 25/065
(Continued)

FOREIGN PATENT DOCUMENTS

JP  2012222038  11/2012
JP  2014060241  4/2014
(Continued)

OTHER PUBLICATIONS

"International Search Report (Form PCT/ISA/210) of PCT/JP2017/035469," dated Dec. 26, 2017, with English translation thereof, pp. 1-2.

*Primary Examiner* — Savitri Mulpuri
(74) *Attorney, Agent, or Firm* — JCIPRNET

(57) ABSTRACT

A method of manufacturing a semiconductor device in which a prescribed target lamination number of semiconductor chips are laminated on a substrate, the method includes: a first lamination step of laminating while temporarily bonding one or more semiconductor chips on the substrate to thereby form a first chip laminate body; a first permanent bonding step of pressurizing while heating from the upper side of the first chip laminate body to thereby collectively and permanently bond the one or more semiconductor chips; a second lamination step of sequentially laminating while temporarily bonding two or more semiconductor chips on the permanently bonded semiconductor chips to thereby form a second chip laminate body; and a second permanent bonding step of pressurizing while heat-
(Continued)

ing from the upper side of the second chip laminate body to thereby collectively permanently bond the two or more semiconductor chips.

4 Claims, 6 Drawing Sheets

(51) Int. Cl.
*H01L 23/00* (2006.01)
*H01L 25/07* (2006.01)
*H01L 25/11* (2006.01)
*H01L 25/065* (2006.01)
*H01L 25/18* (2006.01)

(52) U.S. Cl.
CPC ............ *H01L 25/065* (2013.01); *H01L 25/07* (2013.01); *H01L 25/115* (2013.01); *H01L 25/18* (2013.01); *H01L 25/50* (2013.01); *H01L 2224/16145* (2013.01); *H01L 2224/73204* (2013.01)

(58) Field of Classification Search
CPC ....... H01L 24/81; H01L 25/18; H01L 25/115; H01L 24/97; H01L 25/0652; H01L 23/3114; H01L 25/50; H01L 2224/81092; H01L 2224/83203; H01L 2224/97; H01L 2224/16145; H01L 2224/17181; H01L 2224/73204; H01L 2224/16147; H01L 2224/83907; H01L 2224/16237; H01L 2224/06181; H01L 2224/81203; H01L 2224/8109; H01L 2224/9211; H01L 2224/9205; H01L 2225/06517; H01L 2224/81191; H01L 2224/83092; H01L 2224/83191; H01L 2224/83862; H01L 2224/81815; H01L 2225/06513; H01L 2224/81907; H01L 2224/73104; H01L 2225/06565; H01L 2224/8309; H01L 2224/81; H01L 2224/83

See application file for complete search history.

(56) References Cited

U.S. PATENT DOCUMENTS

2020/0235070 A1\* 7/2020 Nakamura .............. H01L 24/16
2020/0243356 A1\* 7/2020 Nakamura .............. H01L 24/80

FOREIGN PATENT DOCUMENTS

JP  2015095499  5/2015
JP  2017183457  10/2017

\* cited by examiner

METHOD OF MANUFACTURING SEMICONDUCTOR DEVICE, AND MOUNTING APPARATUS

CROSS-REFERENCE TO RELATED APPLICATION

This application is a 371 application of the International PCT application serial no. PCT/JP2017/035469, filed on Sep. 29, 2017, which claims the priority benefit of Japan Patent Application No. 2016-194946, filed on Sep. 30, 2016. The entirety of each of the abovementioned patent applications is hereby incorporated by reference herein and made a part of this specification.

BACKGROUND

Technical Field

The present invention relates to a method of manufacturing a semiconductor device in which a plurality of semiconductor chips are laminated and to a mounting apparatus of semiconductor chips.

Description of Related Art

Conventionally, there has been a demand for higher performance and further miniaturization of semiconductor devices. Therefore, in some cases, it has been proposed to laminate and mount a plurality of semiconductor chips. For example, Patent Document 1 discloses a technique for laminating and mounting a plurality of semiconductor chips. In Patent Document 1, a thermosetting adhesive film is laminated in advance on a bump forming surface of a semiconductor chip. At the time of laminating and mounting, a plurality of semiconductor chips are sequentially laminated on a substrate or another semiconductor chip while being temporarily bonded to form a multistage temporarily bonded laminate body. Next, by pressurizing and heating this multistage temporarily bonded laminate body from the upper side, a permanent bonding step of melting the bumps and curing the thermosetting adhesive film is performed. According to such a technique, since a larger number of semiconductor chips can be mounted in a small area, much higher performance and further miniaturization can be achieved.

RELATED ART

Patent Document

[Patent Document 1] Japanese Laid-open No. 2014-60241

SUMMARY

Technical Problem

Here, of course, in order to realize much higher performance and further miniaturization, it is good if the lamination number of semiconductor chips finally obtained (hereinafter referred to as a "target layer number") is increased. However, as in Patent Document 1, in the case of the technique which, after laminating a target layer number of the semiconductor chips, collectively permanently bonds the target layer number of the semiconductor chips, there is a concern that the semiconductor chips in the lower layer side cannot be properly mounted. That is, in the permanent bonding, the uppermost surface of the multistage temporarily bonded laminate body is pressed by a heated heat tool, whereby the multistage temporarily bonded laminate body is heated. A temperature gradient from the upper part to the lower part is caused by heat transfer. If the lamination number increases and the distance from the heat tool becomes excessively long, the semiconductor chips in the lower layer side is not sufficiently heated. In this case, since the bumps of the semiconductor chips in the lower layer side do not melt sufficiently, or the thermosetting adhesive films do not cure sufficiently, the semiconductor chips in the lower layer side are not properly mounted.

Therefore, in the present invention, an object is to provide a method of manufacturing a semiconductor device and a mounting apparatus that can properly mount each semiconductor chip at the time of laminating and mounting semiconductor chips even when the lamination number is large.

Solution to the Problem

A mounting method of the present invention is a method of manufacturing a semiconductor device in which a prescribed target lamination number of semiconductor chips are laminated on a substrate, including: a first lamination step of sequentially laminating while temporarily bonding one or more semiconductor chips on the substrate to thereby form a first chip laminate body; a first permanent bonding step of heating and pressurizing the first chip laminate body from an upper side to thereby collectively permanently bond the one or more semiconductor chips; a second lamination step of sequentially laminating while temporarily bonding two or more semiconductor chips on permanently bonded semiconductor chips to thereby form a second chip laminate body; and a second permanent bonding step of heating and pressurizing the second chip laminate body from an upper side to thereby collectively permanently bond the two or more semiconductor chips.

In a preferred aspect, after the first lamination step and the first permanent bonding step are performed, the second lamination step and the second permanent bonding step are repeated until a total lamination number of the semiconductor chips reaches the target lamination number.

In another preferred aspect, a plurality of disposition regions are set on the substrate; in the first lamination step and the first permanent bonding step, one semiconductor chip is temporarily bonded and permanently bonded; and the second lamination step is performed after the first permanent bonding step is performed in all of the two or more disposition regions.

Another mounting apparatus of the present invention is a mounting apparatus for laminating and mounting a prescribed target lamination number of semiconductor chips on a substrate, including: a temporary bonding means for heating at a first temperature and pressurizing with a first load from an upper side to thereby temporarily bond the semiconductor chips disposed on the substrate or on a semiconductor chip in a lower layer; a permanent bonding means for heating at a second temperature greater than the first temperature and pressurizing with a second load from an upper side of a chip laminate body, which is a laminate body of one or more semiconductor chips, to thereby collectively permanently bond the one or more semiconductor chips which form the laminate body; and a control part for controlling the temporary bonding means and the permanent bonding means, wherein the control part makes the temporary bonding means and the permanent bonding means perform: a first lamination process for sequentially temporarily bonding one or more semiconductor chips on the substrate by the temporary bonding means to thereby form a first chip laminate body; a first permanent bonding process for collectively permanently bonding the one or more semiconductor chips which form the first chip laminate body by the permanent bonding means; a second lamination process for sequentially laminating while temporarily bonding two or more semiconductor chips on permanently bonded semiconductor chips by the temporary bonding means to thereby form a second chip laminate body; and a second permanent bonding process for collectively permanently bonding the two or more semiconductor chips which form the second chip laminate body by the permanent bonding means.

Another mounting apparatus of the present invention is a mounting apparatus for laminating and mounting a prescribed target lamination number of semiconductor chips on a substrate, including: a bonding part for heating at a first temperature and pressurizing with a first load from an upper side to thereby temporarily bond the semiconductor chips disposed on the substrate or on a semiconductor chip in a lower layer, and for heating at a second temperature greater than the first temperature and pressurizing with a second load from an upper side of a chip laminate body, which is a laminate body of one or more semiconductor chips, to thereby collectively permanently bond the one or more semiconductor chips which form the laminate body; and a control part for controlling the bonding part, wherein the control part includes: a first lamination process part for sequentially temporarily bonding one or more semiconductor chips on the substrate by the bonding part to thereby form a first chip laminate body; a first permanent bonding process part for collectively permanently bonding the one or more semiconductor chips which form the first chip laminate body by the bonding part; a second lamination process part for sequentially laminating while temporarily bonding two or more semiconductor chips on permanently bonded semiconductor chips by the bonding part to thereby form a second chip laminate body; and a second permanent bonding process part for collectively permanently bonding the two or more semiconductor chips which form the second chip laminate body by the bonding part.

Effects

According to the present invention, the lamination step and the permanent bonding step are repeated for at least twice when the prescribed target lamination number of the semiconductor chips are laminated. Therefore, it is not necessary to permanently bond the target lamination number of the semiconductor chips collectively, and the semiconductor chips in the lower layer side can also be sufficiently heated. As a result, at the time of laminating and mounting the semiconductor chips, each semiconductor chip can be properly mounted even when the lamination number is large.

DESCRIPTION OF THE EMBODIMENTS

Figure 1:
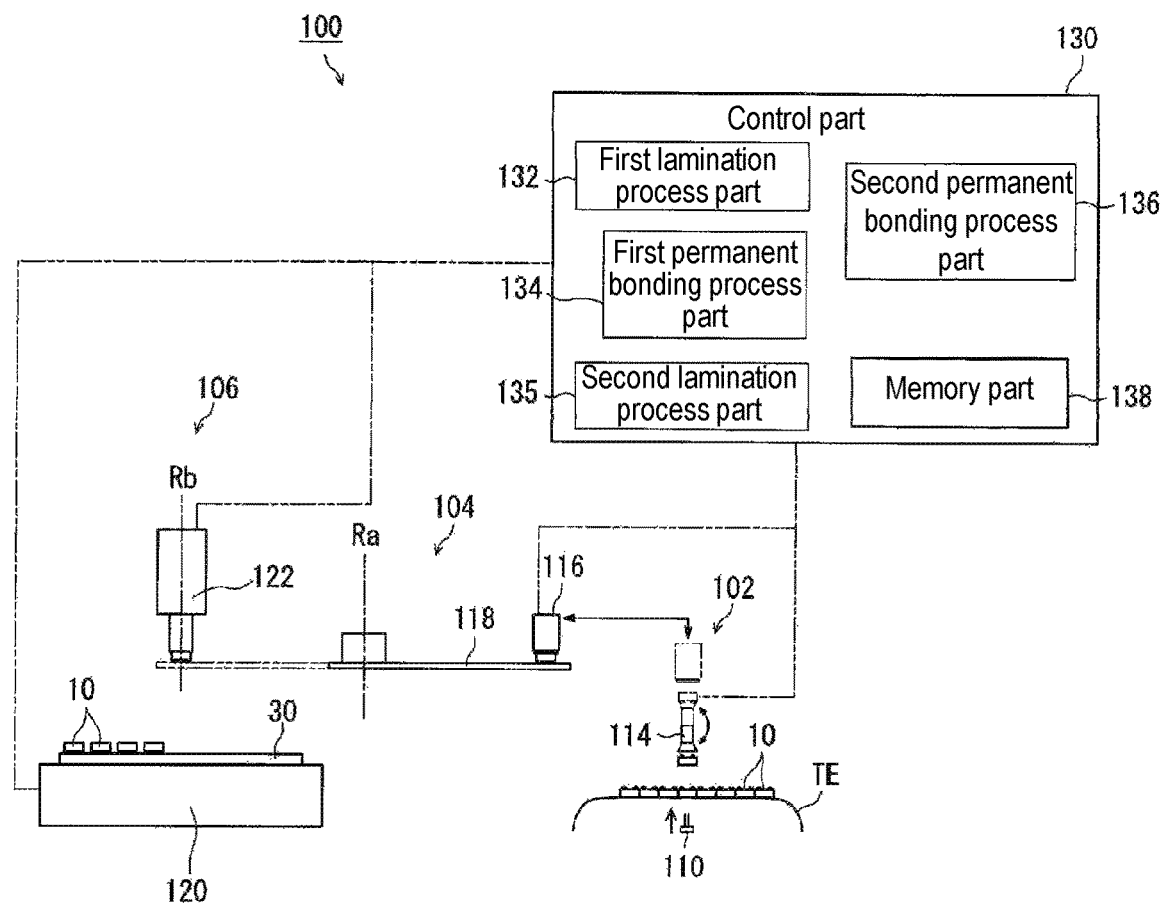
FIG. 1 is a diagram showing a configuration of a mounting apparatus according to an embodiment of the present invention.

Hereinafter, an embodiment of the present invention will be described with reference to the drawings. FIG. 1 is a schematic diagram of a configuration of a mounting apparatus 100 according to an embodiment of the present invention. The mounting apparatus 100 is an apparatus for mounting a semiconductor chip 10 on a substrate 30. The mounting apparatus 100 is configured to be particularly suitable for laminating and mounting a plurality of semiconductor chips 10.

The mounting apparatus 100 includes a chip supplying part 102, a chip transporting part 104, a bonding part 106, and a control part (not shown) for controlling the driving of these components. The chip supplying part 102 is a part for taking out the semiconductor chip 10 from a chip supply source and supplying the semiconductor chip 10 to the chip transporting part 104. The chip supplying part 102 includes a protrusion part 110, a die picker 114, a transfer head 116, and a control part 130 for controlling each part of the mounting apparatus.

In the chip supplying part 102, the plurality of semiconductor chips 10 are placed on a dicing tape TE. At this time, the semiconductor chips 10 are placed in a face-up state in which bumps 18 face upward. The protrusion part 110 pushes up only one semiconductor chip 10 out of the plurality of semiconductor chips 10 in the face-up state at it is. The die picker 114 receives the semiconductor chip 10 pushed up by the protrusion part 110. The die picker 114 that has received the semiconductor chip 10 rotates 180 degrees in situ so that the bumps 18 of the semiconductor chip 10 face downward, that is, so that the semiconductor chip 10 becomes to be in a face-down state. Once in this state, the transfer head 116 receives the semiconductor chip 10 from the die picker 114.

The transfer head 116 can move in the vertical and horizontal directions and can suck and hold the semiconductor chip 10 at its lower end. When the die picker 114 rotates 180 degrees and the semiconductor chip 10 becomes to be in the face-down state, the transfer head 116 sucks and holds the semiconductor chip 10 at its lower end. Thereafter, the transfer head 116 moves in the horizontal and vertical directions to move to the chip transporting part 104.

The chip transporting part 104 has a rotating table 118 which rotates with a vertical rotation axis Ra as the center. The transfer head 116 places the semiconductor chip 10 at a predetermined position of the rotating table 118. The rotating table 118 on which the semiconductor chip 10 is placed rotates with the rotation axis Ra as the center, whereby the semiconductor chip 10 is transported to the bonding part 106 located on the opposite side of the chip supplying part 102.

The bonding part 106 includes a stage 120 for supporting the substrate 30 and a mounting head 122 for holding the semiconductor chip 10 and installing it on the substrate 30. The bonding part 106 functions as a temporary bonding means for temporarily bonding the semiconductor chip 10 and also functions as a permanent bonding means for permanently bonding the semiconductor chip 10. The stage 120 is movable in the horizontal direction and adjusts the relative positional relationship between the substrate 30 placed thereon and the mounting head 122. In addition, a heater is incorporated in the stage 120.

The mounting head 122 can hold the semiconductor chip 10 at its lower end and can rotate and can rise and descend around a vertical rotation axis Rb. The mounting head 122 bonds the semiconductor chip 10 onto the substrate 30 placed on the stage 120 or onto another semiconductor chip 10. Specifically, the mounting head 122 descends so as to press the held semiconductor chip 10 onto the substrate 30 or the like, whereby temporary bonding or permanent bonding of the semiconductor chip 10 is performed. A variable temperature heater is incorporated in the mounting head 122, and the mounting head 122 is heated to a first temperature T1 (to be described later) when performing the temporary bonding and is heated to a second temperature T2 greater than the first temperature T1 when performing the permanent bonding. In addition, the mounting head 122 applies a first load Ft1 to the semiconductor chip 10 when performing the temporary bonding and applies a second load Ft2 to the semiconductor chip 10 when performing the permanent bonding.

A camera (not shown) is provided in the vicinity of the mounting head 122. The substrate 30 and the semiconductor chip 10 are each provided with an alignment mark as a reference for positioning. The camera images the substrate 30 and the semiconductor chip 10 so that the alignment marks are reflected. The control part 130 grasps the relative positional relationship between the substrate 30 and the semiconductor chip 10 based on the image data obtained by this imaging and adjusts the rotation angle of the mounting head 122 around the rotation axis Rb and the horizontal position of the stage 120 according to the needs.

The control part 130 controls the driving of each part and includes, for example, a CPU which performs various calculations and a memory part 138 which stores various data and programs. The control part 130 functions as a first lamination process part 132, a first permanent bonding process part 134, a second lamination process part 135, and a second permanent bonding process part 136 by reading programs from the memory part 138. The first lamination process part 132 forms a first chip laminate body by sequentially temporarily bonding one or more semiconductor chips 10 on the substrate 30 with the bonding part 106. The first permanent bonding process part 134 collectively permanently bonds the one or more semiconductor chips 10 which form the first chip laminate body with the bonding part 106. The second lamination process part 135 forms a second chip laminate body by sequentially laminating while temporarily bonding two or more semiconductor chips 10 on the permanently bonded semiconductor chips 10 with the bonding part 106. The second permanent bonding process part 136 collectively permanently bonds the two or more semiconductor chips 10 which form the second chip laminate body with the bonding part 106.

Note that the configuration of the mounting apparatus 100 described here is an example and is changed as appropriate. For example, in the embodiment, both the temporary bonding and the permanent bonding are performed by one mounting head 122, but a pressurizing head for the temporary bonding and a pressurizing head for the permanent bonding is provided. Further, in the embodiment, the stage 120 is configured to move horizontally, but the mounting head 122 is configured to move horizontally instead of or in addition to the stage 120. In addition, the configurations of the chip supplying part 102, the chip transporting part 104 and the like is changed as appropriate.

Figure 2:
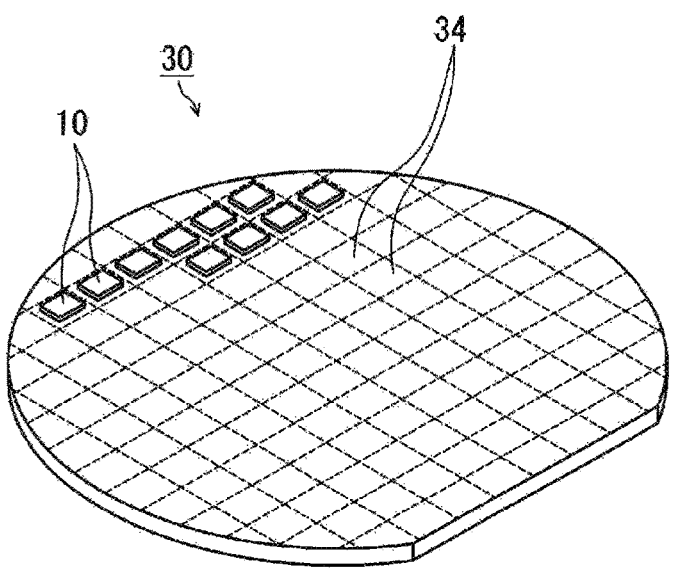
FIG. 2 is a schematic perspective diagram of a semiconductor wafer functioning as a substrate.

Next, mounting of the semiconductor chip 10 by the mounting apparatus 100 will be described. In the embodiment, a semiconductor wafer is used as the substrate 30, and a plurality of semiconductor chips 10 are laminated and mounted on the semiconductor wafer (the substrate 30). Therefore, the mounting process of the embodiment is a chip-on-wafer process in which the semiconductor chips 10 are laminated and mounted on a circuit forming surface of the semiconductor wafer. FIG. 2 is a schematic image diagram of the substrate 30 (the semiconductor wafer) used in the embodiment. As shown in FIG. 2, a plurality of disposition regions 34 arranged in a lattice shape are set on the substrate 30. The plurality of semiconductor chips 10 are laminated and mounted in each of the disposition regions 34.

Figure 3:
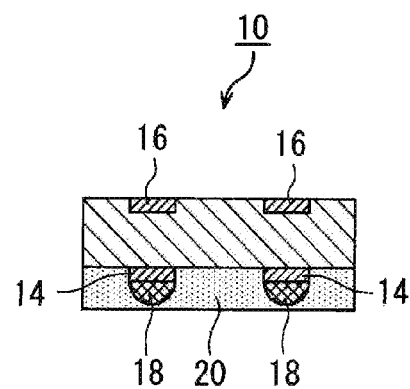
FIG. 3 is a diagram showing a configuration of a semiconductor chip to be mounted.

Next, a configuration of the semiconductor chip 10 will be briefly described. FIG. 3 is a diagram showing a schematic configuration of the semiconductor chip 10 to be mounted. Electrode terminals 14 and 16 are formed on top and bottom surfaces of the semiconductor chip 10. In addition, the bumps 18 are formed on one surface of the semiconductor chip 10 continuously to the electrode terminals 14. The bumps 18 are made of a conductive metal and melt at a predetermined melting temperature Tm.

Further, a non-conductive film (hereinafter referred to as the "NCF") 20 is attached to one surface of the semiconductor chip 10 so as to cover the bumps 18. The NCF 20 functions as an adhesive for bonding the semiconductor chip 10 to the substrate 30 or to another semiconductor chip 10 and is a non-conductive thermosetting resin, such as polyimide resin, epoxy resin, acrylic resin, phenoxy resin, polyethersulfone resin and the like. The thickness of the NCF 20 is greater than the average height of the bumps 18, and the bumps 18 are substantially completely covered by the NCF 20. The NCF 20 is a solid film at normal temperature, but the NCF 20 gradually softens when it exceeds a predetermined softening start temperature Ts and exhibits fluidity, and the NCF 20 starts to irreversibly cure when it exceeds a predetermined curing start temperature Tt.

Here, the softening start temperature Ts is less than the melting temperature Tm of the bumps 18 and the curing start temperature Tt. The first temperature T1 for temporary bonding is greater than the softening start temperature Ts and less than the melting temperature Tm and the curing start temperature Tt. Further, the second temperature T2 for permanent bonding is greater than the melting temperature Tm and the curing start temperature Tt. That is, $Ts<T1<(Tm, Tt)<T2$.

When the semiconductor chip 10 is being temporarily bonded to the substrate 30 or the lower semiconductor chip 10 (hereinafter referred to as the "bonded body"), the mounting head 122 is heated to the first temperature T1 and then pressurizes the semiconductor chip 10. At this time, the NCF 20 of the semiconductor chip 10 is heated to the vicinity of the first temperature T1 by the heat transfer from the mounting head 122, softens, and possesses fluidity. Then, in this way, the NCF 20 can flow into a gap between the semiconductor chip 10 and the bonded body and can securely fill the gap.

When the semiconductor chip 10 is being permanently bonded to the bonded body, the mounting head 122 is heated to the second temperature T2 and then pressurizes the semiconductor chip 10. At this time, the bumps 18 and the NCF 20 of the semiconductor chip 10 are heated to the vicinity of the second temperature T2 by the heat transfer from the mounting head 122. In this way, the bumps 18 can be melted and welded to the opposite bonded body. Further, since the NCF 20 cures in the state of filling the gap between the semiconductor chip 10 and the bonded body by this heating, the semiconductor chip 10 and the bonded body are firmly fixed.

Figure 4:
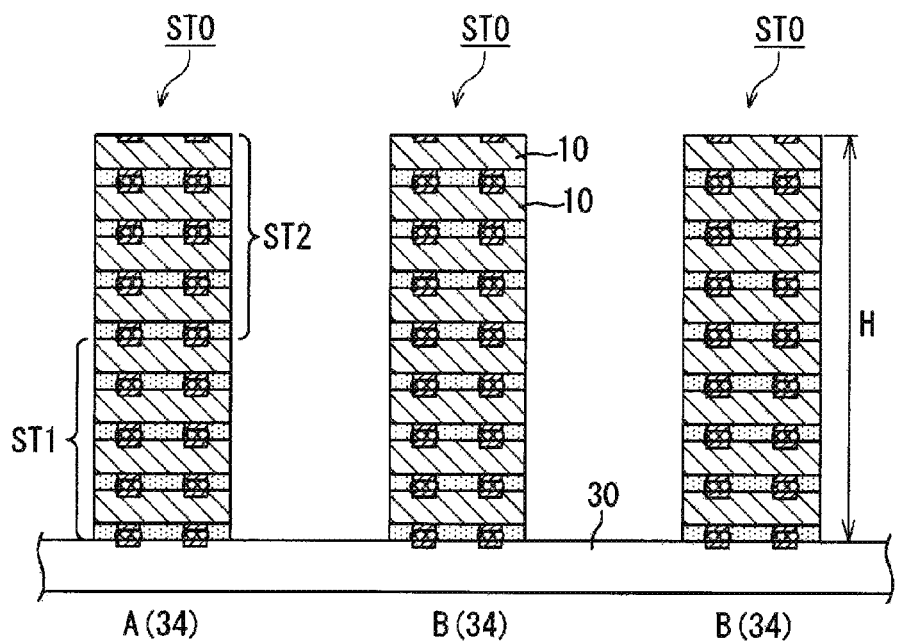
FIG. 4 is a diagram showing a configuration of a semiconductor device.

Next, a semiconductor device manufactured by laminating and mounting the semiconductor chips 10 will be described. FIG. 4 is a diagram showing a configuration of a semiconductor device in which the plurality of semiconductor chips 10 are laminated and mounted on the substrate 30. The semiconductor device is configured by laminating and mounting a target lamination number of semiconductor chips 10 in each of the plurality of disposition regions 34. In the embodiment, the target lamination number is "8", and eight semiconductor chips 10 are laminated and mounted in one disposition region 34. Hereinafter, a thing in which eight semiconductor chips 10 have been laminated and mounted is called a "finished laminate body ST0".

In the embodiment, the finished laminate body ST0 is divided into and treated as a plurality of chip laminate bodies—specifically, a first chip laminate body ST1 and a second chip laminate body ST2. The first chip laminate body ST1 is a laminate body formed by four semiconductor chips 10 laminated on the substrate 30. Further, the second chip laminate body ST2 is a laminate body formed by four semiconductor chips 10 laminated on the first chip laminate body ST1. In the embodiment, after a first lamination step and a first permanent bonding step are performed to form the first chip laminate body ST1, a second lamination step and a second permanent bonding step of forming the second chip laminate body ST2 are performed. In this way, one finished laminate body ST0 is divided into and treated as two or more laminate bodies ST1 and ST2, and this is for well mounting all the semiconductor chips 10, which will be described later.

Figure 5:
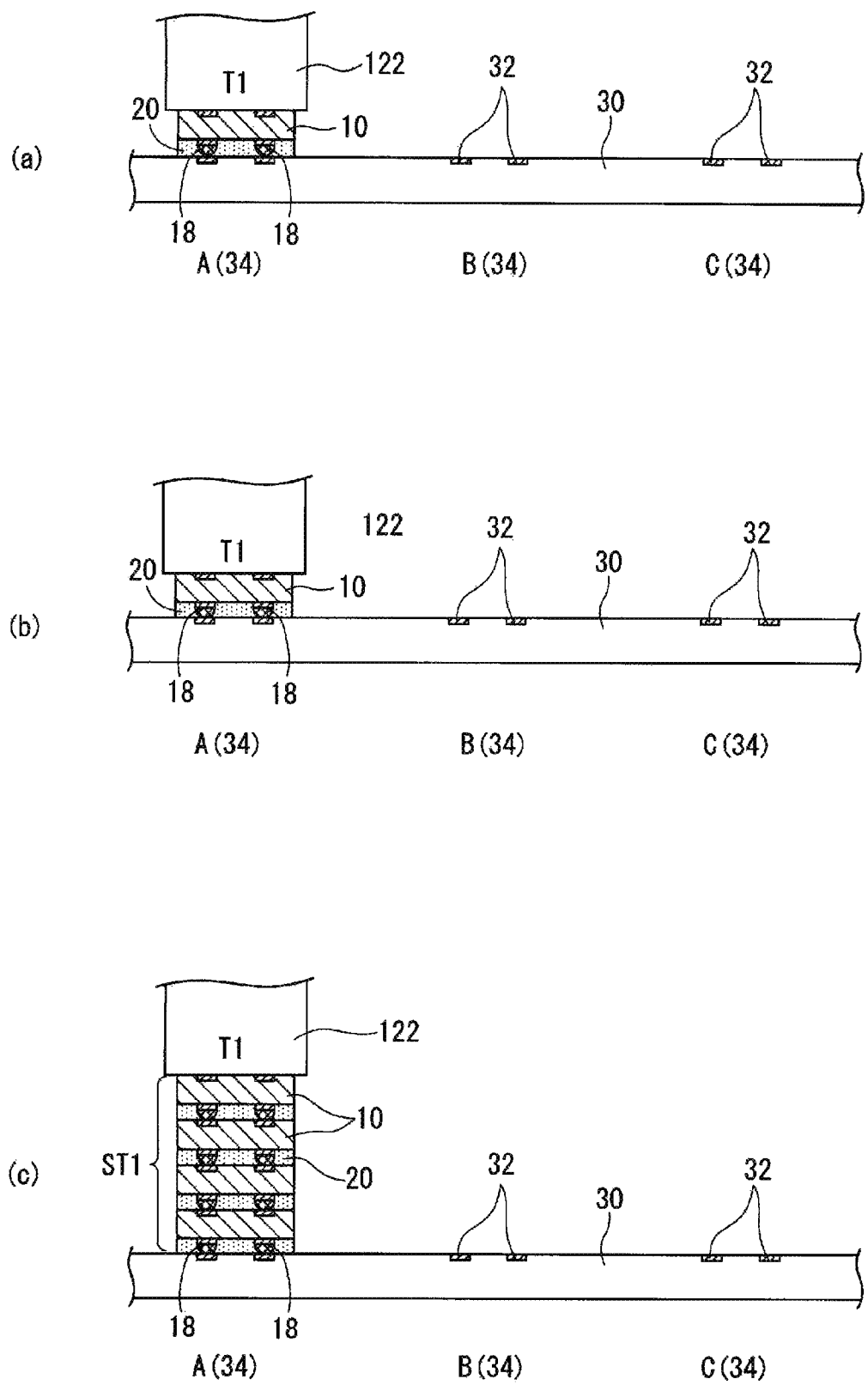
FIG. 5 is a diagram showing a flow of laminating and mounting a plurality of semiconductor chips.
Figure 6:
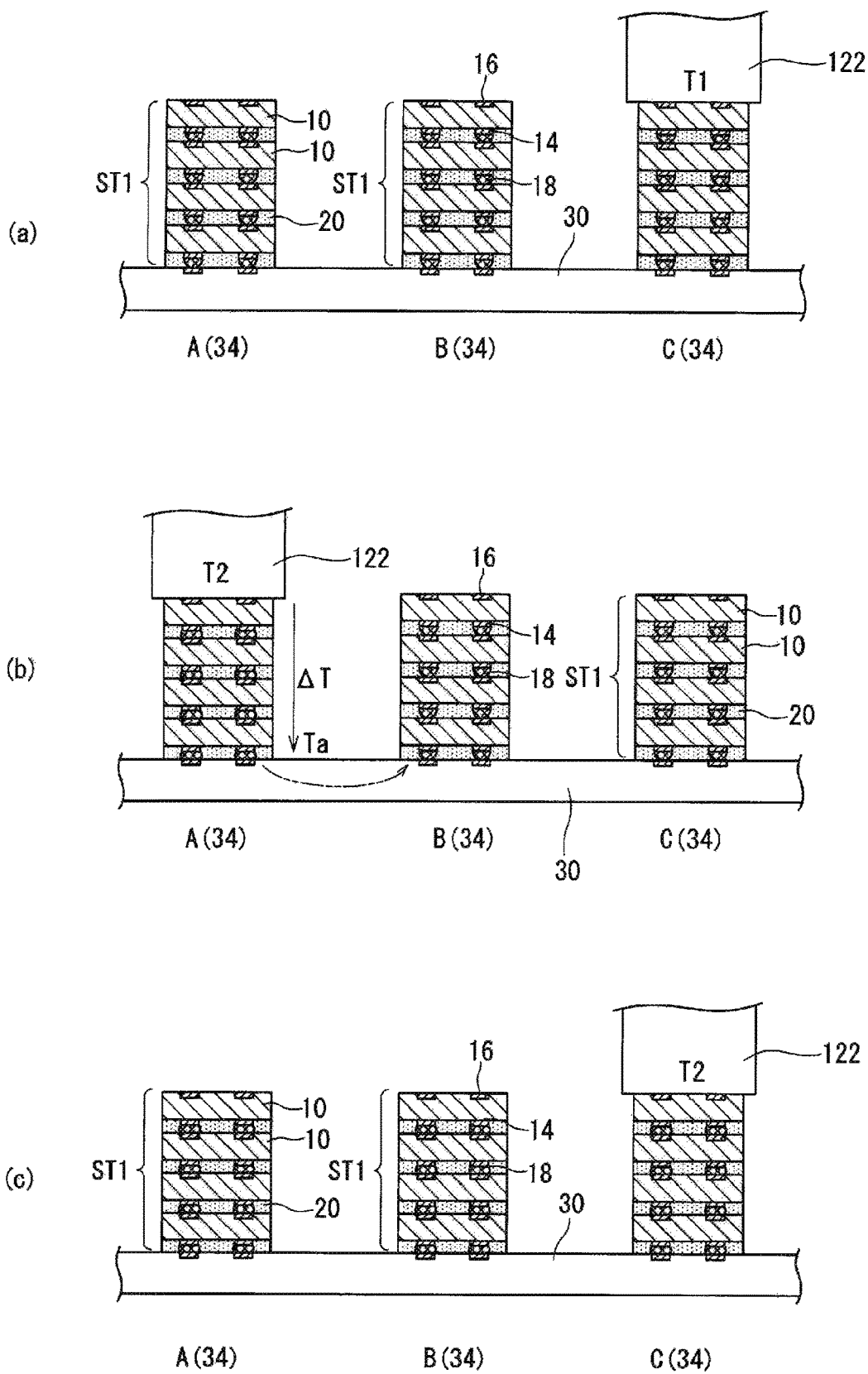
FIG. 6 is a diagram showing a flow of laminating and mounting a plurality of semiconductor chips.
Figure 7:
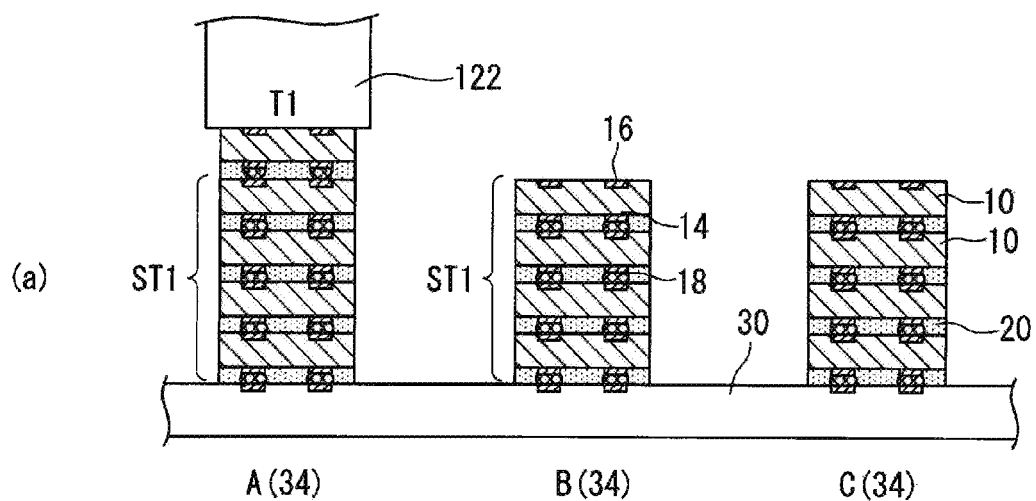
FIG. 7 is a diagram showing a flow of laminating and mounting a plurality of semiconductor chips.
Figure 7:
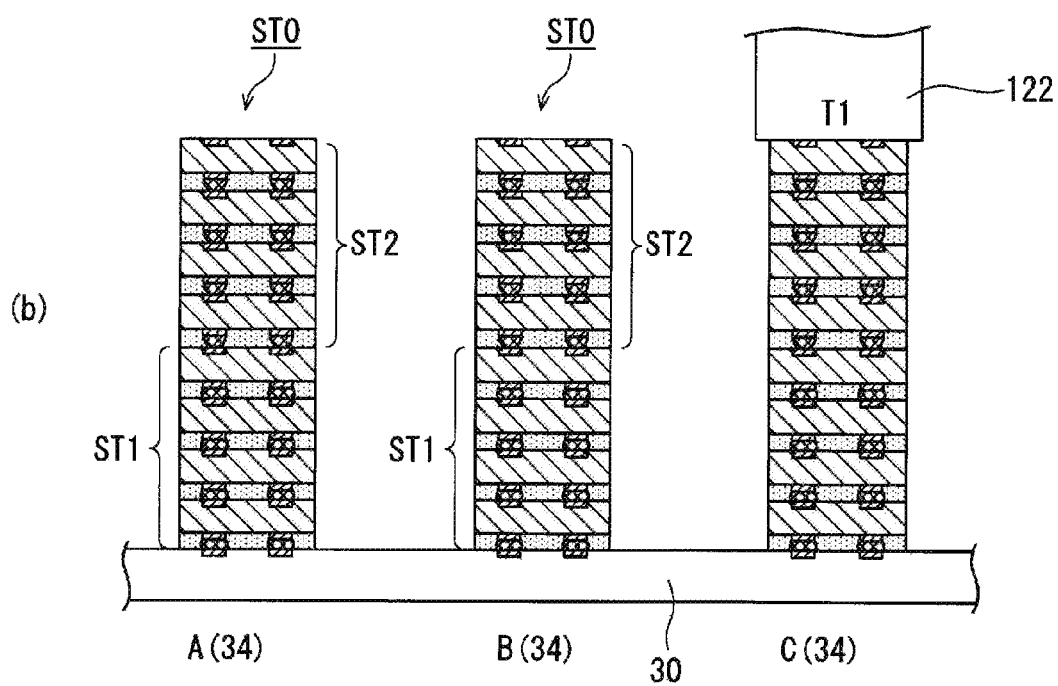

Next, a flow of mounting the semiconductor chips 10 will be described with reference to FIGS. 5 to 7. FIGS. 5 to 7 are image diagrams showing a flow of mounting the semiconductor chips 10. Three disposition regions 34 are illustrated in FIGS. 5 to 7, and for convenience of description, these are referred to as a region A, a region B, and a region C in order from the left side. Further, the mounting procedure described below is performed under normal pressure or is performed in a vacuum to prevent inclusion of air bubbles and the like.

In the embodiment, as described above, first, after the first chip laminate body ST1 is mounted, the second chip laminate body ST2 is further mounted on the first chip laminate body ST1, and finally, the finished laminate body ST0 having eight layers is formed. Each of the chip laminate bodies ST1 and ST2 is mounted by performing a lamination step of sequentially laminating the four semiconductor chips 10 while temporarily bonding them to form the chip laminate bodies ST1 and ST2 in a temporarily bonded state and performing a permanent bonding step of collectively permanently bonding the four semiconductor chips 10 by heating at the second temperature T2 and pressurizing from the upper side of the chip laminate bodies ST1 and ST2.

Specifically speaking, first, at the beginning, as shown in (a) of FIG. 5, the mounting head 122 is used to dispose the semiconductor chip 10 in the region A on the substrate 30. At this time, the substrate 30 is positioned with respect to the semiconductor chip 10 so that the bumps 18 of the semiconductor chip 10 face electrode terminals 32 on the substrate 30. In addition, at this time, the mounting head 122 is heated to the first temperature T1 which is the temperature for temporary bonding. Next, as shown in (b) of FIG. 5, the semiconductor chip 10 is pressurized with the prescribed first load Ft1 by the mounting head 122, and the semiconductor chip 10 is temporarily bonded to the substrate 30. At this time, the NCF 20 is heated to the softening start temperature Ts or more by the heat transfer from the mounting head 122 and exhibits appropriate fluidity. In this way, the NCF 20 fills the gap between the semiconductor chip 10 and the substrate 30 without any gap. In addition, the first load Ft1 is not particularly limited as long as the amount of the first load Ft1 allows the bumps 18 to contact the electrode terminals 32 of the substrate 30 by pushing away the softened NCF 20 without significantly deforming the bumps 18.

When the first-layer semiconductor chip 10 can be temporarily bonded, then the second-layer semiconductor chip 10 is further temporarily bonded onto the temporarily bonded first-layer semiconductor chip 10. When the second-layer semiconductor chip 10 is being temporarily bonded, the same as the case in the first-layer semiconductor chip 10, the mounting head 122 is used to dispose the second-layer semiconductor chip 10 on the first-layer semiconductor chip 10 so that the bumps 18 of the second-layer semiconductor chip 10 face the electrode terminals 16 of the first-layer semiconductor chip 10. Then, in this state, the second-layer semiconductor chip 10 is heated at the first temperature T1 and pressurized with the first load Ft1 to be temporarily bonded to the first-layer semiconductor chip 10.

Thereafter, similarly, the third-layer semiconductor chip 10 is temporarily bonded onto the second-layer semiconductor chip 10, and the fourth-layer semiconductor chip 10 is temporarily bonded onto the third-layer semiconductor chip 10. (c) of FIG. 5 shows a mode in which four layers of the semiconductor chips 10 are laminated in the region A while being temporarily bonded. The step of laminating the four semiconductor chips 10 is the first lamination step, and the formed laminate body becomes the first chip laminate body ST1 in the temporarily bonded state.

When the first chip laminate body ST1 in the temporarily bonded state can be formed in the region A, the first chip laminate bodies ST1 in the temporarily bonded state are also formed in other disposition regions 34, such as the region B and the region C, in the same procedure. (a) of FIG. 6 shows a mode in which four semiconductor chips 10 are laminated while being temporarily bonded to form the first chip laminate bodies ST1 in the temporarily bonded state in all the disposition regions 34.

When the first chip laminate bodies ST1 in the temporarily bonded state can be formed in all the disposition regions 34, then the first permanent bonding step is performed for permanently bonding the first chip laminate bodies ST1. Specifically, first, the mounting head 122 is heated to the second temperature T2 which is the temperature for permanent bonding. Then, as shown in (b) of FIG. 6, the first chip laminate body ST1 in the temporarily bonded state is pressurized with the second load Ft2 by the mounting head 122 heated to the second temperature T2, and the four semiconductor chips 10 are permanently bonded collectively. The second load Ft2 is not particularly limited as long as the pressing amount of the bumps 18 can be properly maintained.

By being pressed by the mounting head 122 heated to the second temperature T2, the four semiconductor chips 10 forming the first chip laminate body ST1 are also heated. However, the heating temperature decreases as the distance from the mounting head 122 increases. Specifically, the uppermost-layer (fourth-layer) semiconductor chip 10 is heated to substantially the same temperature as the second temperature T2, but the lowermost-layer (first-layer) semiconductor chip 10 is heated to a lower layer temperature Ta=T2−ΔT, which is less than the second temperature T2 by ΔT. The second temperature T2 is set so that the lower layer temperature Ta becomes greater than the melting temperature Tm and the curing start temperature Tt. That is, at the time of permanent bonding, all the four semiconductor chips 10 forming the first chip laminate body ST1 are heated to a temperature greater than the melting temperature Tm and the curing start temperature Tt.

Each semiconductor chip 10 is heated to above the curing start temperature Tt, whereby the NCF 20 of the semiconductor chip 10 gradually cures. Then, by curing the NCF 20, the semiconductor chip 10 and the bonded body (the substrate 30 or the lower semiconductor chip 10) are firmly fixed mechanically. In addition, the bumps 18 can be melted and glued to the opposite electrode terminals 32 and 16 by being heated to above the melting temperature Tm. Then, in this way, the four semiconductor chips 10 and the substrate 30 become to be in a mounting state in which they are electrically bonded to each other. Then, the step of collectively permanently bonding the four semiconductor chips 10 which form the first chip laminate body ST1 becomes the first permanent bonding step.

When one first chip laminate body ST1 can be permanently bonded, subsequently, other first chip laminate bodies ST1 are also permanently bonded. That is, the first permanent bonding step is performed in all of the two or more disposition regions 34 such as the region B, the region C and the like. (c) of FIG. 6 shows a mode in which the first permanent bonding step is performed in all the disposition regions 34.

When the first permanent bonding step is performed in all the disposition regions 34, subsequently, the second lamination step is performed for forming the second chip laminate bodies ST2 in the temporarily bonded state on the first chip laminate bodies ST1. Specifically, the temperature of the mounting head 122 is lowered to the first temperature T1 which is the temperature for temporary bonding. Thereafter, as shown in (a) and (b) of FIG. 7, another four semiconductor chips 10 are sequentially laminated while being temporarily bonded on the permanently bonded first chip laminate bodies ST1. In this way, the formed laminate bodies are the second chip laminate bodies ST2, and the step of forming the second chip laminate bodies ST2 is the second lamination step. The second lamination step is also performed in all of the two or more disposition regions 34. When the second chip laminate bodies ST2 in the temporarily bonded state are formed in all the disposition regions 34, finally, the second permanent bonding step is performed for permanently bonding all the second chip laminate bodies ST2. Then, when all the second chip laminate bodies ST2 are permanently bonded, the mounting step is completed.

As is clear from the above description, in the embodiment, one finished laminate body ST0 is divided into a plurality of (two in this example) chip laminate bodies ST1 and ST2, and the lamination step and the permanent bonding step are performed for each of the chip laminate bodies ST1 and ST2. The reason for this process procedure will be described in comparison with conventional techniques.

Conventionally, a technique for laminating and mounting a plurality of semiconductor chips 10 is known. However, in the conventional mounting technique, permanent bonding is performed after all the target lamination number of the semiconductor chips 10 have been laminated. That is, in the example of FIG. 4, after having been laminated while being temporarily bonded, the eight semiconductor chips 10 are heated at the second temperature T2 and pressurized from the upper side of the eighth-layer semiconductor chip 10. In the case of this procedure, since the switching of the heating temperature of the mounting head 122 (switching between the first temperature T1 and the second temperature T2) is performed only once, the time required for the temperature rise and fall of the mounting head 122 can be reduced, and thus the time for the entire mounting process can be shortened. However, in the case of the conventional technique, there has been a concern that the semiconductor chip 10 in the lower layer cannot be properly heated and that the curing of the NCF 20 and the melting of the bumps 18 are insufficient.

That is, in the conventional technique, in the case of laminating and mounting eight semiconductor chips 10, the heated mounting head 122 presses the uppermost-layer (eighth-layer) semiconductor chip 10 to permanently bond the eight semiconductor chips 10 collectively. However, in this case, when the lamination number is large, a distance H from the mounting head 122 to the semiconductor chip 10 in the lower layer is long. As the distance H from the mounting head 122, which is a heat source, increases, the heating temperature also decreases accordingly. As a result, there has been a concern that the semiconductor chip 10 in the lower layer cannot be heated sufficiently and that the curing of the NCF 20 and the melting of the bumps 18 are insufficient.

Here, of course, if the temperature of the mounting head 122 is increased, the temperature of the semiconductor chip 10 in the lower layer can be maintained high. However, in consideration of the temperature gradient between the upper-layer chip and the lower-layer chip as previously described, a temperature greater than the first temperature is required. As a result, since the melting of the bumps 18 of the upper-layer chip and the accompanying alloy reaction occur, and further, the curing and deterioration of the NCF 20 also occurs, the reliability is significantly impaired. Therefore, the mounting head 122 cannot be heated to an excessively high temperature.

Therefore, in the embodiment, as described above, the finished laminate body ST0 formed by the target lamination number of semiconductor chips is divided into a plurality of chip laminate bodies ST1 and ST2, and the lamination step and the permanent bonding step are performed for each of the chip laminate bodies ST1 and ST2. With this process procedure, when the permanent bonding is performed, the distance from the mounting head 122 to the semiconductor chip 10 in the lower layer can be shortened. Therefore, the lower layers of the chip laminate bodies ST1 and ST2 can be properly heated without excessively raising the second temperature T2 which is the temperature for permanent bonding. As a result, at the time of laminating and mounting the semiconductor chips 10, each semiconductor chip 10 can be properly mounted even when the lamination number is large.

Figure 8:
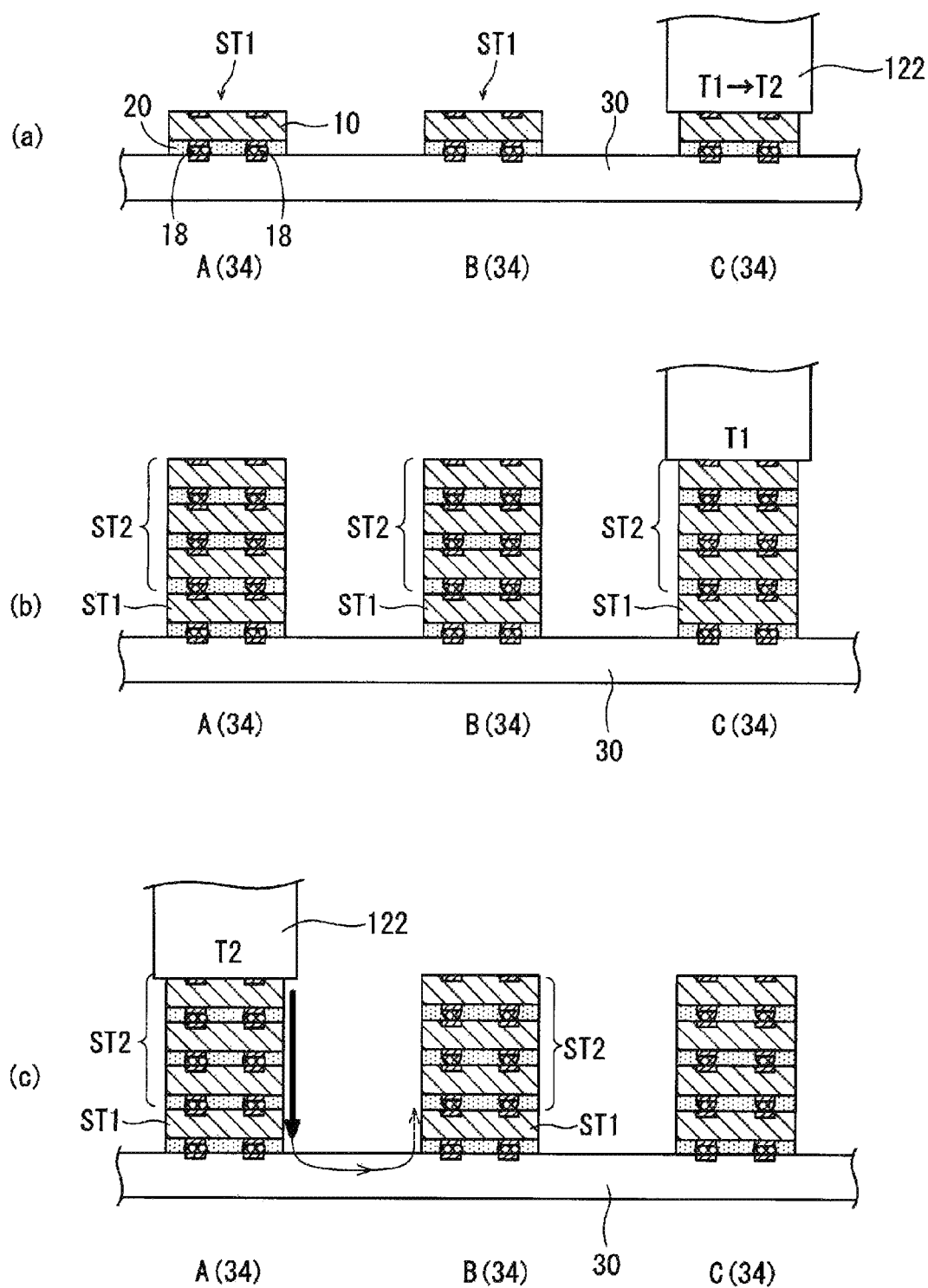
FIG. 8 is a diagram showing another example of a flow of laminating and mounting a plurality of semiconductor chips.

Next, another embodiment will be described with reference to FIG. 8. FIG. 8 is an image diagram showing another mounting procedure. This embodiment is different from the first embodiment in that the first chip laminate body ST1 is formed by one semiconductor chip 10. Moreover, in the embodiment, after one first chip laminate body ST1 is formed, the next first chip laminate body ST1 is formed. Specifically speaking, in the embodiment, first, one semiconductor chip 10 is disposed in one disposition region 34 (the region A) by the mounting head 122 heated to the first temperature T1. Then, in this state, the first load Ft1 is applied to temporarily bond the semiconductor chip 10. Thereafter, the mounting head 122 is heated to the second temperature and then pressurizes the semiconductor chip 10 with the second load Ft2. That is, the first lamination step and the first permanent bonding step are continuously performed. In this step, one permanently bonded semiconductor chip 10 becomes the first chip laminate body ST1. When the first chip laminate body ST1 can be forming in the region A, subsequently, the first chip laminate bodies ST1 are also sequentially formed in the region B and the region C which are the remaining disposition regions 34. (a) of FIG. 8 shows a mode in which the first chip laminate bodies ST1 are formed in all the disposition regions 34.

Once in this state, subsequently, the second chip laminate bodies ST2 are formed. The formation procedure of the second chip laminate bodies ST2 is the same as that in the first embodiment. That is, a plurality of (three in the example shown in the drawings) semiconductor chips 10 are sequentially laminated while being temporarily bonded on the first chip laminate body ST1 by the mounting head 122 heated to the first temperature T1, and the second chip laminate body ST2 in the temporarily bonded state is formed. When one second chip laminate body ST2 can be formed, then other second chip laminate bodies ST2 are also formed in other disposition regions 34 in the same way. That is, the second lamination step is performed in all of the two or more disposition regions 34. (b) of FIG. 8 is a diagram showing a mode in which the second chip laminate bodies ST2 in the temporarily bonded state are formed. Subsequently, the mounting head 122 pressurizes the second chip laminate bodies ST2 in a state in which the mounting head 122 is heated to the second temperature T2 for permanent bonding and collectively permanently bonds the four semiconductor chips 10. (c) of FIG. 8 is a diagram showing the mode of the second permanent bonding step. When the second permanent bonding step is completed in one disposition region 34, the second permanent bonding step is performed in the remaining disposition regions 34 in the same way. Thereafter, the second lamination step and the second permanent bonding step are repeated until the total lamination number of the semiconductor chips 10 reaches the target lamination number. For example, in the case where the target lamination number is "8", once in the state shown of (c) of FIG. 8, subsequently, after four layers of the semiconductor chips 10 have been further laminated on each second chip laminate body ST2 while being temporarily bonded, the second lamination step and the second permanent bonding step is performed for the second time for permanent bonding. Further, in the case where the target lamination number is "10", after the second lamination step and the second permanent bonding step have been performed for the second time as described above, two layers of the semiconductor chips 10 are further laminated while being temporarily bonded, and then the second lamination step and the second permanent bonding step is performed for the third time for permanent bonding.

By the way, as is clear from the above description, in the embodiment, the chip lamination number of the first chip lamination body ST1 is one. In other words, after the first-layer semiconductor chips 10 are permanently bonded in all of the two or more disposition regions 34, the second-layer and subsequent layers of the semiconductor chips are laminated. The reason for this configuration is as follows.

The substrate 30 in the embodiment is a semiconductor wafer made of silicon or the like. The semiconductor wafer has a high thermal conductivity compared with a normal resin substrate or the like. Therefore, the heat applied to the chip laminate body in the region A by the permanent bonding is transferred to the chip laminate body in the adjacent region B. At this time, as shown in (b) of FIG. 6, it is assumed that the first-layer semiconductor chip 10 in the region B adjacent to the region A is in the temporarily bonded state when the chip laminate body in the region A is being permanently bonded. In this case, the heat transferred via the chip laminate body in the region A and the substrate 30 is also transferred to the first-layer semiconductor chip 10 in the region B. Then, the transferred heat causes the NCF 20 of the first-layer semiconductor chip 10 in the region B to start to cure. As described above, when the NCF 20 cures prior to the permanent bonding, the fixing of the semiconductor chip 10 to the substrate 30 becomes insufficient.

Therefore, in the embodiment, to prevent unintended curing of the NCF 20, the lamination of the second-layer and subsequent layers of the semiconductor chips 10 are performed after all of the first-layer semiconductor chips 10 are permanently bonded. In the case of this configuration, as shown in (c) of FIG. 8, the heat when the second-layer and subsequent layers of the semiconductor chips 10 are being permanently bonded in the region A is also transferred to the first-layer semiconductor chip 10 in the region B via the chip laminate body in the region A and the substrate 30. However, since the first-layer semiconductor chip 10 in the region B has already been permanently bonded, no problem occurs even if the heat is transferred thereto. Further, the heat is also transferred to the second-layer and subsequent layers of the semiconductor chips 10 in the region B via the first-layer semiconductor chip 10 in the region B. However, since the heat path from the heat source (the mounting head 122) is long for the second-layer and subsequent layers of the semiconductor chips 10 in the region B, the amount of heat transfer is small, and the curing of the NCFs 20 is unlikely to occur. Furthermore, the permanently bonded semiconductor chip 10 is interposed on the way of the heat path from the heat source to the second-layer and subsequent layers of the semiconductor chips 10 in the region B. In the permanently bonded semiconductor chip 10, the NCF 20 has completely cured, and the cured NCF 20 functions as a shielding material that impedes heat transfer. By interposing the permanently bonded semiconductor chip 10, the amount of heat transfer to the second-layer and subsequent layers of the semiconductor chips 10 in the region B can be significantly reduced.

In other words, the first-layer semiconductor chips 10 are permanently bonded in all of the disposition regions 34 in advance, whereby unintended curing of the NCFs of the second-layer and subsequent layers of the semiconductor chips 10 can be effectively prevented. Further, according to the embodiment, even if the temperature of the mounting head 122 is set to be high, unintended curing of the NCFs 20 in the adjacent regions do not occur. As a result, since the temperature of the mounting head 122 can be set to be high, the degree of freedom in setting the temperature of the mounting head 122 can be improved.

Note that the configuration described above is an example and is changed to other configurations as appropriate as long as the lamination step and the permanent bonding step can be repeated twice or more in forming one finished laminate body ST0. For example, the performance order of the temporary bonding and the permanent bonding is changed as appropriate.

For example, in the embodiment, the permanent bonding step is performed after the lamination step is completed in all of the plurality of disposition regions 34, but the lamination step and the permanent bonding step are performed serially for each disposition region 34. That is, the first lamination step, the first permanent bonding step, the second lamination step, and the second permanent bonding step are performed in the region B after the first lamination step, the first permanent bonding step, the second lamination step, and the second permanent bonding step are continuously performed in the region A. In the case of this configuration, the number of times of switching the temperature of the mounting head 122 is increased, but there is no laminate body in the temporarily bonded state present in the vicinity of the laminate body being permanently bonded. As a result, unintended curing of NCF 20 can be prevented.

Further, the permanent bonding is performed continuously when the uppermost-layer semiconductor chip 10 in each of the chip laminate bodies ST1 and ST2 is temporarily bonded. Specifically, in the first embodiment, when the first chip laminate body ST1 is formed, the semiconductor chips 10 are laminated while being temporarily bonded to the third layer in each of the regions A to C. Thereafter, in the region A, the fourth-layer semiconductor chip 10 is pressurized and temporarily bonded by the mounting head 122 heated to the first temperature T1. When the fourth-layer semiconductor chip 10 can be pressurized, the temperature of the mounting head 122 is raised to the second temperature T2 in the state in which the mounting head 122 has pressurized the fourth-layer semiconductor chip 10, and the mounting head 122 performs permanent bonding. In this case, when the permanent bonding of the fourth-layer semiconductor chip 10 in the region A is completed, the mounting head 122 is cooled to the first temperature T1 and then performs temporary bonding of the fourth-layer semiconductor chip 10 in the region B, and thereafter, the mounting head 122 is raised to the second temperature T2 and performs permanent bonding. In the case of this configuration, the number of times of switching the temperature of the mounting head 122 is increased, but the movement amount of the mounting head 122 can be reduced.

Further, though in the above description, both the temporary bonding and the permanent bonding are performed by one mounting head 122, a mounting head for the temporary bonding and a mounting head for the permanent bonding are provided separately. In this case, the mounting head dedicated to temporary bonding is always heated to the first temperature T1, and the mounting head dedicated to permanent bonding is always heated to the second temperature T2. With this configuration, since the switching of the temperature of the mounting heads is not required, the time required for the temperature rise and fall of the mounting heads can be eliminated, and the mounting time can be further reduced. Further, at this time, the mounting head for permanent bonding is set to a size that can heat and pressurize (permanently bond) two or more chip laminate bodies simultaneously.

In addition, the lamination number of the first chip laminate body is not particularly limited as long as it is one or more. In addition, the lamination number of the second chip laminate body is not particularly limited as long as it is two or more. However, when the lamination number of one chip laminate body is excessively large, the heat of permanent bonding applied to the uppermost surface is not sufficiently transferred to the lowermost layer, which causes a mounting failure. Therefore, the lamination number of the chip laminate body is set to be less than or equal to the number at which the heat of permanent bonding can be properly transferred to the lowermost layer. The number at which heat can be properly transferred varies depending on the material and configuration of the semiconductor chip 10, but in the case of using a general semiconductor chip 10, the lamination number of one chip laminate body is preferably four or less. Further, though in the embodiment, a semiconductor wafer is used as the substrate 30, the substrate 30 is not limited to a semiconductor wafer and may be other types of substrates.

What is claimed is:

1. A method of manufacturing a semiconductor device in which a prescribed target lamination number of semiconductor chips are laminated on a substrate, the method comprising:
   a first lamination step of sequentially laminating while temporarily bonding one or more semiconductor chips on the substrate to thereby form a first chip laminate body;
   a first permanent bonding step of heating and pressurizing the first chip laminate body from an upper side to thereby permanently bond collectively the one or more semiconductor chips;
   a second lamination step of sequentially laminating while temporarily bonding two or more semiconductor chips on permanently bonded semiconductor chips to thereby form a second chip laminate body; and
   a second permanent bonding step of heating and pressurizing the second chip laminate body from an upper side to thereby permanently bond collectively the two or more semiconductor chips.

2. The method of manufacturing a semiconductor device according to claim 1, wherein after the first lamination step and the first permanent bonding step are performed, the second lamination step and the second permanent bonding step are repeated until a total lamination number of the semiconductor chips reaches the target lamination number.

3. The method of manufacturing a semiconductor device according to claim 1, wherein
   a plurality of disposition regions are set on the substrate,
   in the first lamination step and the first permanent bonding step, one semiconductor chip is temporarily bonded and permanently bonded, and
   the second lamination step is performed after the first permanent bonding step is performed in all of the two or more disposition regions.

4. The method of manufacturing a semiconductor device according to claim 2, wherein
   a plurality of disposition regions are set on the substrate,
   in the first lamination step and the first permanent bonding step, one semiconductor chip is temporarily bonded and permanently bonded, and
   the second lamination step is performed after the first permanent bonding step is performed in all of the two or more disposition regions.

* * * * *